(12) United States Patent
Luo et al.

(10) Patent No.: US 9,964,702 B1
(45) Date of Patent: May 8, 2018

(54) SURFACE-NORMAL OPTICAL COUPLING INTERFACE WITH THERMAL-OPTIC COEFFICIENT COMPENSATION

(71) Applicant: Oracle International Corporation, Redwood Shores, CA (US)

(72) Inventors: Ying Luo, San Diego, CA (US); Xuezhe Zheng, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days. days.

(21) Appl. No.: 15/292,501

(22) Filed: Oct. 13, 2016

(51) Int. Cl.
| | | |
|---|---|---|
| *G02B 6/12* | (2006.01) | |
| *G02B 6/132* | (2006.01) | |
| *G02B 6/136* | (2006.01) | |
| *H01S 5/30* | (2006.01) | |
| *H01S 5/026* | (2006.01) | |
| *H01S 5/10* | (2006.01) | |

(52) U.S. Cl.
CPC ..... *G02B 6/12004* (2013.01); *G02B 6/12002* (2013.01); *G02B 6/132* (2013.01); *G02B 6/136* (2013.01); *H01S 5/026* (2013.01); *H01S 5/1014* (2013.01); *H01S 5/3013* (2013.01); *G02B 2006/12104* (2013.01); *G02B 2006/12147* (2013.01)

(58) Field of Classification Search
CPC .... G02B 6/12004; G02B 6/132; G02B 6/136; G02B 6/12002; G02B 2006/12147; G02B 2006/12104; H01S 5/026; H01S 5/3013; H01S 5/1014
See application file for complete search history.

(56) References Cited

U.S. PATENT DOCUMENTS 7,408,183 B2 * 8/2008 Behfar .................. G11B 7/127
257/22
9,509,119 B2 * 11/2016 Chen ..................... H01S 5/0612

OTHER PUBLICATIONS

Resnik et al.; "The role of Triton surfactant in anisotropic etching of {1 1 0} reflective planes on (1 0 0) silicon," J. Micromech. Microeng. vol. 15, 1174, (2005).
(Continued)

*Primary Examiner* — John M Bedtelyon
(74) *Attorney, Agent, or Firm* — Park, Vaughan, Fleming & Dowler LLP

(57) ABSTRACT

The disclosed embodiments provide a system that implements an optical interface. The system includes a semiconductor chip with a silicon layer, which includes a silicon waveguide, and an interface layer (which can be comprised of SiON) disposed over the silicon layer, wherein the interface layer includes an interface waveguide. The system also includes an optical coupler that couples an optical signal from the silicon waveguide in the silicon layer to the interface waveguide in the interface layer, wherein the interface waveguide channels the optical signal in a direction parallel to a top surface of the semiconductor chip. The system additionally includes a mirror, which is oriented to reflect the optical signal from the interface waveguide in a surface-normal direction so that the optical signal exits the top surface of the semiconductor chip.

19 Claims, 6 Drawing Sheets

(56) References Cited

OTHER PUBLICATIONS

Mohrle et al.; "1300-nm horizontal-cavity surface-emitting BH-DFB lasers for uncooled operation", IEEE Photon. Tech. Lett. vol. 18, No. 8, (2006).

Shinoda et al.; "Monolithically lens-integrated photonic device arrays for compact optical transceivers", Jpn. J. Appl. Phys. vol. 52, 0022701, (2013).

\* cited by examiner

SURFACE-NORMAL OPTICAL COUPLING INTERFACE WITH THERMAL-OPTIC COEFFICIENT COMPENSATION

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The disclosed embodiments relate to the design of optical interfaces for silicon-photonic chips. More specifically, the disclosed embodiments relate to the design of a surface-normal optical interface for a silicon-photonic chip that provides thermal-optic coefficient compensation.

Related Art

During the past few years, silicon photonics has gained increasing acceptance as a platform of choice for providing photonic integration for short-reach optical communications. At present, a number of useful silicon-photonic devices, such as modulators, detectors and basic passive components, are being fabricated by silicon foundries. However, technical challenges arise when light has to be coupled into and out of silicon chips to facilitate off-chip communications. In particular, there is typically a huge mismatch in the size of the mode field between silicon waveguides and optical waveguides fabricated with other materials, such as optical fibers and III-V semiconductor optical amplifiers (SOAs).

Generally, two approaches are used to efficiently couple light into or out of silicon: edge coupling and vertical coupling. Out-of-plane coupling based on grating couplers has been intensively researched with typical implementations achieving coupling losses below 3 dB for transverse-electric polarization, and 30-45 nm 1 dB spectral bandwidth. Due to mode-size conversion to an approximately 10 μm spot at the chip interface, grating couplers provide an attractive option with relaxed alignment requirements, allowing for wafer-scale assembly and mass manufacturing. However, this type of coupler suffers from low optical bandwidth, and its polarization-sensitive nature greatly limits its applications when two polarizations are involved.

On the other hand, edge coupling with spot-size converters (SSCs) effectively provides highly efficient, polarization-insensitive, and broad-bandwidth optical coupling. However, this approach requires very precise control over the vertical alignment between certain materials, such as MN semiconductors and silicon, and it also involves deep etching of a silicon recess area, or substrate thinning of silicon on insulator (SOI), which makes the integration process very complex. Therefore, this type of coupling does not provide an economical solution for optical packaging.

Hence, what is needed is a technique for providing optical coupling with a silicon chip that does not suffer from the above-described drawbacks of existing techniques.

SUMMARY

The disclosed embodiments provide a system that implements an optical interface. This system includes a semiconductor chip with a silicon layer, which includes a silicon waveguide, and an interface layer comprised of an interface material disposed over the silicon layer, wherein the interface layer includes an interface waveguide. The system also includes an optical coupler that couples an optical signal from the silicon waveguide in the silicon layer to the interface waveguide in the interface layer, wherein the interface waveguide channels the optical signal in a direction parallel to a top surface of the semiconductor chip. The system additionally includes a mirror, which is oriented to reflect the optical signal from the interface waveguide in a surface-normal direction so that the optical signal exits a surface normal coupler on the top surface of the semiconductor chip.

In some embodiments, the system further comprises an optical gain chip bonded to the top surface of the semiconductor chip, wherein the optical gain chip is comprised of an optical gain material and includes a reflective semiconductor optical amplifier (RSOA). This optical gain chip is oriented so that the reflected optical signal that exits the surface normal coupler feeds into the RSOA, whereby the RSOA, the interface waveguide, the mirror, the silicon waveguide and a reflector, which is optically coupled to the silicon waveguide, form a lasing cavity.

In some embodiments, the lasing cavity includes a length $l_{Si}$ through silicon, a length $l_I$ through the interface material, and a length $l_{OGM}$ through the optical gain material. Moreover, the effective refractive index of silicon is $n_{Si}$, the effective refractive index of the interface material is $n_I$, and the effective refractive index of the optical gain material is $n_{OGM}$. Hence, the effective thermal optic coefficient (TOC) of silicon is $dn_{Si}/dT$, the effective TOC of the interface material is $dn_I/dT$, and the effective TOC of the optical gain material is $dn_{OGM}/dT$. In these embodiments, $l_I$ and $l_{OGM}$ are selected so that $l_I \approx l_{OGM}*(dn_{OGM}/dT - dn_{Si}/dT)/(dn_{Si}/dT - dn_I/dT)$, whereby the effective TOC of a section of the lasing cavity that passes through the optical gain material and the interface material is substantially the same as the TOC of silicon.

In some embodiments, the interface material comprises one of: SiON, SiN and sapphire.

In some embodiments, the optical gain material comprises a semiconductor.

In some embodiments, the system further comprises a laser output optically coupled to the lasing cavity.

In some embodiments, the system further comprises a spot-size converter (SSC) integrated into the interface waveguide, which increases the mode-field size of the optical signal before the optical signal exits the semiconductor chip.

In some embodiments, the mirror comprises a reflectively coated etched surface of a sacrificial silicon layer, wherein the sacrificial silicon layer is disposed over the silicon layer at a same level as the interface layer.

In some embodiments, the system further comprises an anti-reflection coating to reduce back reflection, which is applied to an output facet of the semiconductor chip.

In some embodiments, the semiconductor chip comprises a double silicon on insulator (SOI) platform, comprising: a substrate; a first silicon dioxide ($SiO_2$) layer disposed over the substrate; the silicon layer disposed over the $SiO_2$ layer; a second $SiO_2$ layer disposed over the silicon layer; the interface layer disposed over a portion of the second $SiO_2$ layer; and a sacrificial silicon layer disposed over a portion of the second $SiO_2$ layer at a same level as the interface layer, wherein the sacrificial silicon layer is etched and reflectively coated to form the mirror.

In some embodiments, the semiconductor chip is fabricated through the following operations: depositing a first $SiO_2$ layer over a substrate; depositing the silicon layer over the first $SiO_2$ layer; patterning a silicon circuit on the silicon layer; depositing a second $SiO_2$ layer over the silicon layer; bonding a sacrificial silicon layer over the second $SiO_2$ layer; etching the sacrificial silicon layer to form a surface of the mirror; depositing a reflective coating on the surface of the mirror; depositing the interface layer over the semiconductor chip to match a thickness of the sacrificial semiconductor layer; and performing a chemical mechanical planarization (CMP) operation on the semiconductor chip after the interface material deposition.

DETAILED DESCRIPTION

Figure 1:
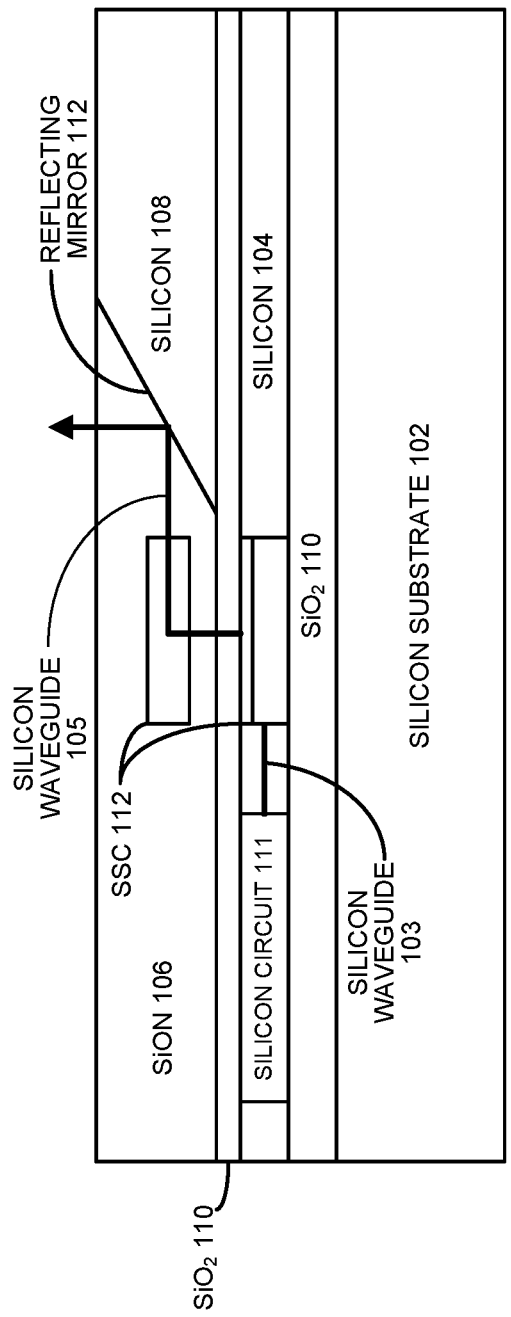
FIG. 1 illustrates a surface-normal optical interface on a hybrid double silicon on insulator (SOI) platform in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Surface-Normal Optical Interface

In this disclosure, we teach a novel optical interface, which makes use of a simple surface-normal vertical-coupling approach that combines the advantages of both edge couplers and grating couplers. The proposed interface uses a 45-degree facet mirror formed on a top layer of silicon to provide vertical light coupling. At the same time, spot-size converters (SSCs) are implemented on a thick interface layer comprised of a material such as SiON, which is evanescently coupled to a lower silicon-waveguide layer to minimize the mode mismatch between silicon and associated output components. This hybrid vertical coupler provides very low integration loss with relaxed alignment requirements. In addition, by using this type of surface-normal coupling interface with carefully optimized waveguide lengths, hybrid silicon lasers can be built with stable light emission, and without any mode-hopping in uncooled work environments.

A large number of photonic components are presently available on the SOI platform. However, the high index contrast nature of the SOI platform makes it very challenging to couple light in or out of silicon to other optical components, especially when these components are built on low-index contrast materials. For most applications, light couplers with low insertion loss, broad optical band, and relaxed integration and packaging requirements are preferred. The proposed vertical coupler described herein can be built using SiON on a double SOI hybrid platform to meet the above-listed performance requirements.

FIG. 1 illustrates an exemplary optical coupling interface constructed on a double SOI platform comprising a silicon substrate 102, a $SiO_2$ layer 110, a thin silicon layer 104, another $SiO_2$ layer 110, and a top thick silicon layer 108. Referring to FIG. 1, an optical signal from silicon waveguide 103, which is located in thin silicon layer 104 and attached to silicon circuit 111, is evanescently coupled to a SiON waveguide 105 in a SiON layer 106, wherein SiON layer 106 sits atop a silicon inverse taper in the bottom of thin silicon layer 104. This optical signal is subsequently expanded both horizontally and vertically through a SiON taper. The expanded light is then directed to a reflecting mirror 112 formed on a 45-degree facet in top thick silicon layer 108, and reflected vertically to pass out of the device surface. An anti-reflection coating is typically applied to the output facet to remove possible back reflection. Depending on the waveguide dimensions of the connecting optical components, the thickness of SiON layer 106 and top silicon layer 108 can be optimized to match the mode size of the connecting waveguide.

By minimizing the loss from mode mismatching, this vertical coupling using 45-degree mirror 112 can be a very low-loss process. In addition, since there is no strong wavelength dependency from mirror 112, this coupling scheme also provides a broad optical band operation range. Furthermore, the use of a SiON spot-size converter (SSC) 115 permits an expansion of the waveguide mode profile in both the vertical and horizontal directions, leading to much relaxed alignment tolerance. Therefore, this vertical coupler can be easily integrated with lensed fibers, fiber arrays, and III-V gain materials while using a wafer-scale assembling process.

Note that the angled mirror 112 could be realized with dry etch on dielectrics, such as: SiO2, or SiON. However, due to the amorphous nature of these materials, it is very challenging to form a 45-degree facet on a 2-3 µm thick layer without any surface curving or corner rounding. On the other hand, wet etching of crystal silicon with the etch window on a <100> plane is aligned with a <111> crystal plane, and an accurate facet with a 54.7° angle can be obtained. Also, when the etch opening on the <100> plane is aligned with a <110> silicon crystal plane, an etched facet with a 45° angle can also be obtained with accurate facet positions. (See Drago Resnik, Danilo Vrtacnik, Uros Aljancic, Matej Mozek and Slavko Amon, "The role of Triton surfactant in anisotropic etching of {110} reflective planes on (100) silicon," *J. Micromech. Microeng.* Vol. 15, 1174, 2005.) Hence, during assembly, we can introduce a sacrificial thick silicon layer 108 via wafer-bonding onto the already processed SOI wafer to form high quality 45-degree (or 54.7°) reflecting mirror 112.

Figure 2:
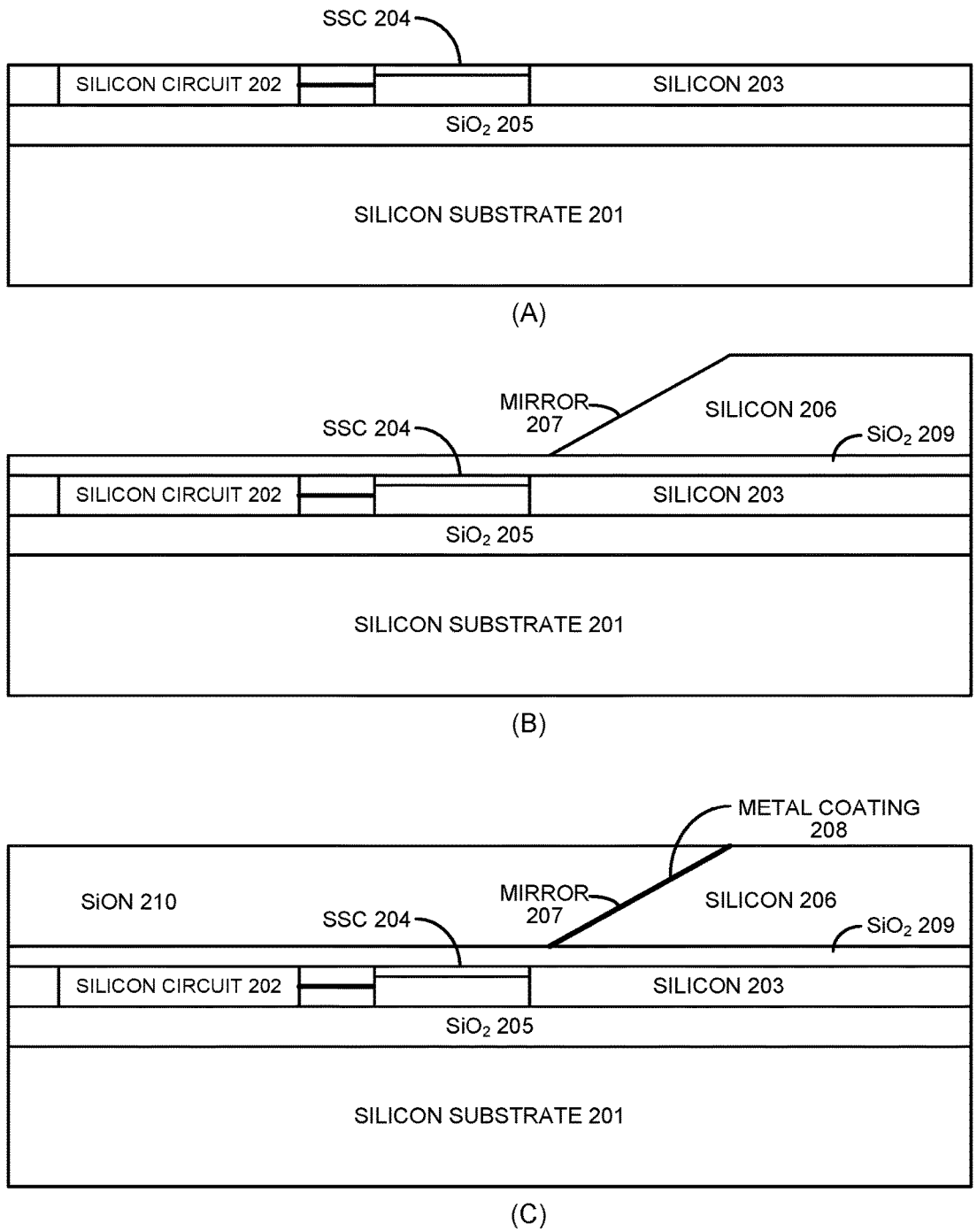
FIG. 2 illustrates a process flow involved in fabricating a surface-normal optical interface in accordance with the disclosed embodiments.

FIG. 2 illustrates a general process flow involved in building such a hybrid vertical coupler. More specifically, FIG. 2 illustrates a vertical coupler in three different stages of manufacture (A), (B) and (C). As is illustrated in stage (A), a silicon circuit 202 is patterned on a sub-micron (220-300 nm) silicon layer 203, which is itself deposited over a $SiO_2$ layer 205 that resides on top of a silicon substrate 201. Also, a spot-size converter (SSC) 204 based on an inverse taper is formed at the same time.

Next, as illustrated in stage (B), a second thin $SiO_2$ layer 209 is formed over silicon layer 203. Then, a thick silicon layer 206, having a thickness to match the optical mode of a connecting waveguide, is bonded to $SiO_2$ layer 209 through a wafer-bonding technique. Next, a mirror 207 comprising a 45° facet (or a 54.7° facet) is formed in silicon layer 206 through a wet-etch technique.

Then, as illustrated in stage (C), a metal coating 208 is applied to mirror 207 to provide high reflectivity. This is following by a SiON deposition operation to form a SiON layer 210 having a thickness that matches the thickness of silicon layer 206. After SiON layer 210 is deposited, a chemical mechanical process (CMP) is used to re-planarize the wafer. Finally, the SiON taper and waveguide (not shown) are formed to align with silicon layer 203 and mirror 207.

Figure 3:
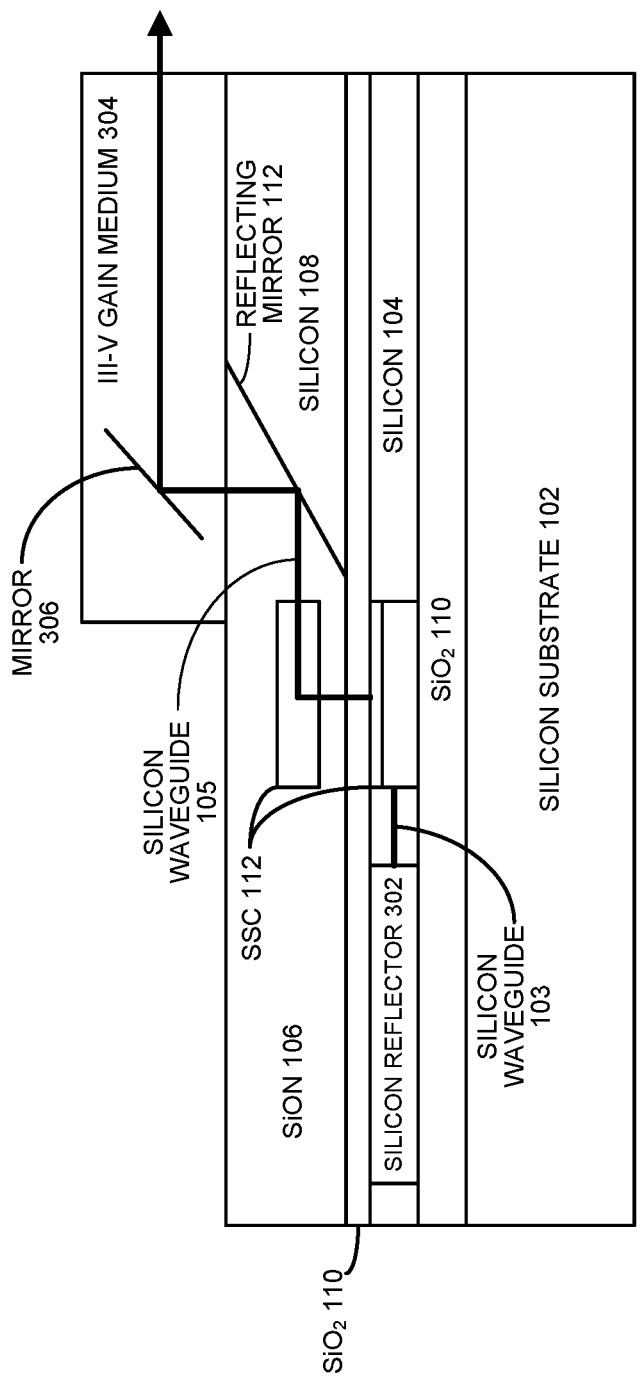
FIG. 3 illustrates a hybrid silicon laser that includes a surface-normal optical interface in accordance with the disclosed embodiments.

As illustrated in FIG. 3, the aforementioned surface-normal coupling interface can be used to form a hybrid silicon laser cavity, wherein a discrete III-V semiconductor gain medium 304 is bonded to the surface-normal coupling interface illustrated in FIG. 1. This III-V gain medium 304 is equipped with a matching facet mirror 306, which can be implemented at the active region without affecting the optical gain, and can be formed through an optimized dry-etching process on the side of the gain cavity. Also, an anti-reflection coating can be applied to the output facet to minimize residual reflection in the hybrid laser cavity. This hybrid layer cavity also includes a silicon reflector 302 (such as a ring resonator) located in silicon layer 104 at the end of silicon waveguide 103. It also includes a high reflective coating applied at the cleaved or dry etched facet of the III-V gain medium 304, which provides an optical feedback for the laser. In an exemplary embodiment, SiON layer 106 is about 3 microns thick, thin silicon layer 104 is about 220-300 nm thick, top SiO2 layer 110 is about 100 nm and bottom SiO2 layer 110 is about 1-2 microns thick. Note that this type of laser, which is formed by connecting a silicon chip to III-V gain medium 304 with through surface-normal coupling, facilitates wafer-scale testing, because unlike systems that rely on edge-coupling, this coupling interface can be tested without breaking up the wafer.

In most applications, thermal-drift can make it challenging to provide a stable light source, and the mismatch in the thermo-optic (TO) index coefficients among the materials in a hybrid laser cavity is typically the root cause for this power fluctuation, which is usually reflected as kinks in L-I curves or mode-hopping in the laser spectrum. In typical laser structures, the lasing mode is determined by the phase relations between the cavity modes and the wavelength filter. Any changes of the effective index (and hence propagation constant) of the waveguides due to temperature variations will change the positions of laser cavity modes and the filter reflection peak. Although a cavity phase tuner and/or a filter wavelength tuner can be used to lock the cavity mode with filter peaks in certain operation or bias conditions, this alignment will be changed or even destroyed when there is a waveguide temperature change from current fluctuation or ambient temperature change, due to the mismatch in the TO coefficients of III-V and the silicon. Therefore, continuous tuning with an active feedback control loop is needed to keep a constant mode-filter alignment to provide a stable laser output. To solve this problem, we propose to use the low-TO SiON layer to compensate for the large TO drift from the III-V semiconductor, and to thereby make the effective TO of the hybrid laser cavity equivalent to the TO of the silicon waveguide. The TO coefficients of silicon and the III-V gain material are $1.86 \times 10^{-4}$ $K^{-1}$ and $2.5 \sim 3 \times 10^{-4}$ $K^{-1}$, respectively, while SiON has a much lower TO coefficient, which is in the range of $0.1 \sim 0.4 \times 10^{-4}$ $K^{-1}$ depending on the different compositions of the SiON material. Because the spectrum of the wavelength filter is solely determined by the silicon, it is possible to build a hybrid optical path that has an average TO coefficient equaling that of silicon. Under constant bias current, the gain medium, the SiON layer, and the silicon parts of the laser cavity will have the same temperature change when the ambient temperature changes. The mode will drift with ambient temperature as determined by the silicon substrate temperature, but no mode-hopping will occur because all the cavity modes will move at exactly the same rate as the silicon filter. Note that this will generally hold true even if there is a known or expected difference in temperature (i.e., a known temperature gradient) among the gain, SiON, and silicon layers.

Assume that the effective lengths of the three materials (Si, SiON and III-V) in the hybrid cavity are: $L_1$, $L_2$, and $L_3$, respectively; their effective refractive indices are $n_1$, $n_2$, and $n_3$, respectively; and their TO coefficients are $dn_1/dT$, $dn_2/dT$ and $dn_3/dT$, respectively. The changes in the optical path of cavity mode $\Delta nL$ due to temperature variation $\Delta T$ can be expressed as:

$$\Delta nL = (dn_1/dT * L_1 + dn_2/dT * L_2 + dn_3/dT * L_3) * \Delta T. \quad (1)$$

In order to track the thermal drift from a silicon filter, we would like to carefully choose the SiON path length, so that the average do/dT of the hybrid cavity is equal to $dn_1/dT$. Therefore, we have:

$$L_2 = (dn_3/dT - dn_1/dT)/(dn_1/dT - dn_2/dT) * L_3, \quad (2)$$

which, in a typical hybrid laser scheme, will be around 200~300 μm.

With this SiON waveguide design, we not only achieve low-loss vertical integration; more importantly, we also allow the cavity modes to drift at the same pace as the silicon filter in any operating temperature. Once the initial alignment is done, this laser does not require any further active tuning to keep it from mode-hopping due to thermal mismatch. Although the laser wavelength will still change when there is a temperature change, this drift is much smaller compared with a normal III-V laser, which makes it much more suitable for un-cooled applications.

How a Surface-Normal Interface Processes Optical Signals

Figure 4A:
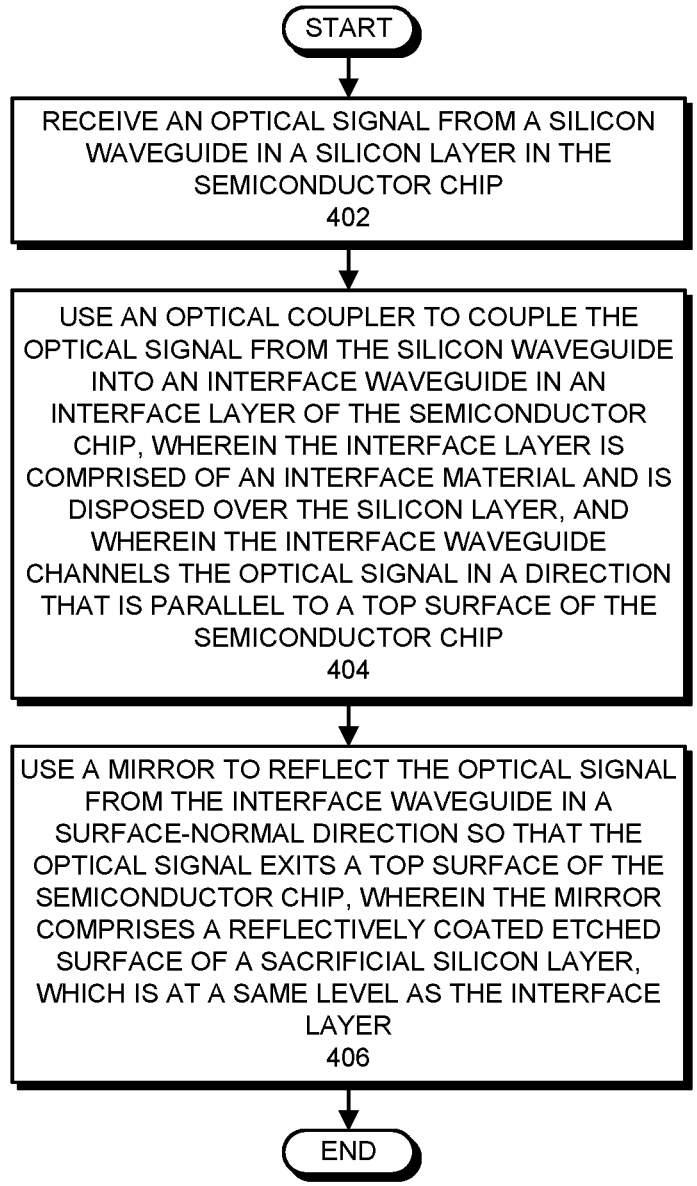
FIG. 4A presents a flow chart illustrating how a surface-normal optical interface handles an outgoing optical signal in accordance with an embodiment of the present disclosure.

FIG. 4A presents a flow chart illustrating how a surface-normal optical interface handles an outgoing optical signal in accordance with an embodiment of the present disclosure. First, the interface receives an optical signal from a silicon waveguide in a silicon layer in the semiconductor chip (step 402). Next, the interface uses an optical coupler to couple the optical signal from the silicon waveguide into an interface waveguide in an interface layer of the semiconductor chip, wherein the interface layer is comprised of an interface material and is disposed over the silicon layer, and wherein the interface waveguide channels the optical signal in a direction parallel to a top surface of the semiconductor chip (step 404). Finally, the interface uses a mirror to reflect the optical signal from the interface waveguide in a surface-normal direction so that the optical signal exits a top surface of the semiconductor chip, wherein the mirror comprises a reflectively coated etched surface of a sacrificial silicon layer, which is at a same level as the interface layer (step 406).

Figure 4B:
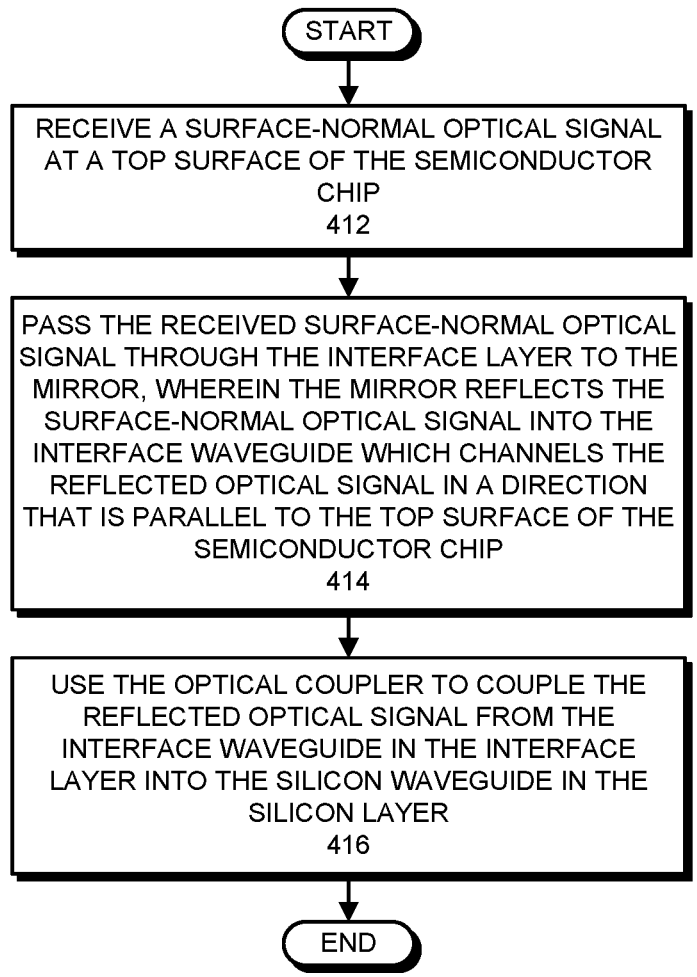
FIG. 4B presents a flow chart illustrating how a surface-normal optical interface handles an incoming optical signal in accordance with an embodiment of the present disclosure.

FIG. 4B presents a flow chart illustrating how the surface-normal optical interface handles an incoming optical signal in accordance with an embodiment of the present disclosure. First, the interface receives a surface-normal optical signal at a top surface of the semiconductor chip (step 412). Next, the interface passes the received surface-normal optical signal through the interface layer to the mirror, wherein the mirror reflects the surface-normal optical signal into the interface waveguide which channels the reflected optical signal in a direction parallel to the top surface of the semiconductor chip (step 414). Finally, the interface uses the optical coupler to couple the reflected optical signal from the interface waveguide in the interface layer into the silicon waveguide in the silicon layer (step 416).

System

Figure 5:
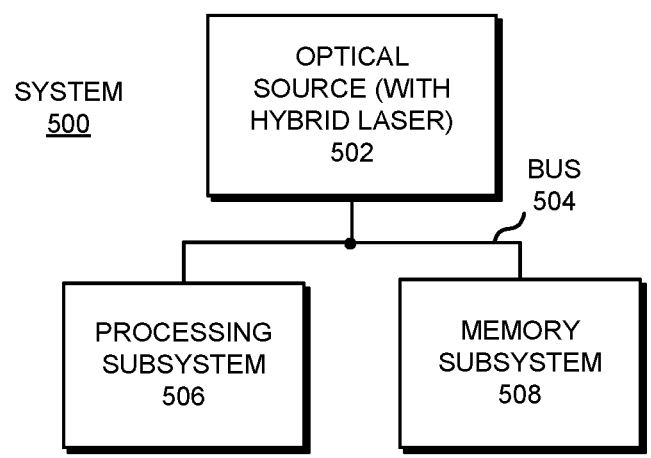
FIG. 5 illustrates a system that includes an optical source, such as a laser, in accordance with an embodiment of the present disclosure.

One or more of the preceding embodiments of the tunable laser may be included in a system or device. More specifically, FIG. 5 illustrates a system 500 that includes an optical source 502 implemented using a hybrid laser. System 500 also includes a processing subsystem 506 (with one or more processors) and a memory subsystem 508 (with memory).

In general, components within optical source 502 and system 500 may be implemented using a combination of hardware and/or software. Thus, system 500 may include one or more program modules or sets of instructions stored in a memory subsystem 508 (such as DRAM or another type of volatile or non-volatile computer-readable memory), which, during operation, may be executed by processing subsystem 506. Furthermore, instructions in the various modules in memory subsystem 508 may be implemented in: a high-level procedural language, an object-oriented programming language, and/or in an assembly or machine language. Note that the programming language may be compiled or interpreted, e.g., configurable or configured, to be executed by the processing subsystem.

Components in system 500 may be coupled by signal lines, links or buses, for example bus 504. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 500 may be at one location or may be distributed over multiple, geographically dispersed locations.

System 500 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 502 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An interface, comprising:
a semiconductor chip with a silicon layer, which includes a silicon waveguide, and an interface layer comprised of an interface material disposed over the silicon layer, wherein the interface layer includes an interface waveguide;
an optical coupler that couples an optical signal from the silicon waveguide in the silicon layer to the interface waveguide in the interface layer, wherein the interface waveguide channels the optical signal in a direction parallel to a top surface of the semiconductor chip; and
a mirror, which is oriented to reflect the optical signal from the interface waveguide in a surface-normal direction so that the optical signal exits a surface normal coupler on the top surface of the semiconductor chip, wherein the mirror comprises a reflectively coated etched surface of a sacrificial silicon layer, wherein the sacrificial silicon layer is disposed over the silicon layer at a same level as the interface layer.

2. The interface of claim 1, further comprising an optical gain chip bonded to the top surface of the semiconductor chip, wherein the optical gain chip is comprised of an optical gain material and includes a reflective semiconductor optical amplifier (RSOA), and wherein the optical gain chip is oriented so that the reflected optical signal that exits the surface normal coupler feeds into the RSOA, whereby the RSOA, the interface waveguide, the mirror, the silicon waveguide and a reflector, which is optically coupled to the silicon waveguide, form a lasing cavity.

3. The interface of claim 2,
wherein the lasing cavity includes a length $l_{Si}$ through silicon, a length $l_I$ through the interface material, and a length $l_{OGM}$ through the optical gain material;
wherein the effective refractive index of silicon is $n_{Si}$, the effective refractive index of the interface material is $n_I$, and the effective refractive index of the optical gain material is $n_{OGM}$;
wherein the effective thermal optic coefficient (TOC) of silicon is $dn_{Si}/dT$, the effective TOC of the interface material is $dn_I/dT$, and the effective TOC of the optical gain material is $dn_{OGM}/dT$; and
wherein $l_I \approx l_{OGM}*(dn_{OGM}/dT - dn_{Si}/dT)/(dn_{Si}/dT - dn_I/dT)$, whereby the effective TOC of a section of the lasing cavity that passes through the optical gain material and the interface material is substantially the same as the TOC of silicon.

4. The interface of claim 2, wherein the interface material comprises one of: SiON, SiN and sapphire.

5. The interface of claim 2, wherein the optical gain material comprises a semiconductor.

6. The interface of claim 2, further comprising a laser output optically coupled to the lasing cavity.

7. The interface of claim 1, further comprising a spot-size converter (SSC) integrated into the interface waveguide, which increases the mode-field size of the optical signal before the optical signal exits the semiconductor chip.

8. The interface of claim 1, further comprising an antireflection coating to reduce back reflection, which is applied to an output facet of the semiconductor chip.

9. The interface of claim 1, wherein the semiconductor chip comprises a double silicon on insulator (SOI) platform, comprising:
a substrate;
a first silicon dioxide ($SiO_2$) layer disposed over the substrate;
the silicon layer disposed over the $SiO_2$ layer;
a second $SiO_2$ layer disposed over the silicon layer;
the interface layer disposed over a portion of the second $SiO_2$ layer; and
a sacrificial silicon layer disposed over a portion of the second $SiO_2$ layer at a same level as the interface layer, wherein the sacrificial silicon layer is etched and reflectively coated to form the mirror.

10. The interface of claim 1, wherein the semiconductor chip is fabricated through the following operations:
depositing a first $SiO_2$ layer over a substrate;
depositing the silicon layer over the first $SiO_2$ layer;
patterning a silicon circuit on the silicon layer;
depositing a second $SiO_2$ layer over the silicon layer;
bonding a sacrificial silicon layer over the second $SiO_2$ layer;
etching the sacrificial silicon layer to form a surface of the mirror;
depositing a reflective coating on the surface of the mirror;
depositing the interface layer over the semiconductor chip to match a thickness of the sacrificial semiconductor layer; and
performing a chemical mechanical planarization (CMP) operation on the semiconductor chip after the interface material deposition.

11. A system, comprising:
at least one processor;
at least one memory coupled to the at least one processor; and
a laser for communicating optical signals generated by the system, wherein the laser comprises:
a semiconductor chip with a silicon layer, which includes a silicon waveguide, and an interface layer comprised of an interface material disposed over the silicon layer, wherein the interface layer includes an interface waveguide;
an optical coupler that couples an optical signal from the silicon waveguide in the silicon layer to the interface waveguide in the interface layer, wherein the interface waveguide channels the optical signal in a direction parallel to a top surface of the semiconductor chip;
a mirror that is oriented to reflect the optical signal from the interface waveguide in a surface-normal direction so that the optical signal exits a surface-normal coupler on the top surface of the semiconductor chip;
an optical gain chip bonded to the top surface of the semiconductor chip, wherein the optical gain chip is comprised of an optical gain material and includes a reflective semiconductor optical amplifier (RSOA), and wherein the optical gain chip is oriented so that the reflected optical signal that exits the surface normal coupler feeds into the RSOA, whereby the RSOA, the interface waveguide, the mirror, the silicon waveguide and a reflector, which is optically coupled to the silicon waveguide, form a lasing cavity; and
a laser output optically coupled to the lasing cavity.

12. The system of claim 11,
wherein the lasing cavity includes a length $l_{Si}$ through silicon, a length $l_I$ through the interface material, and a length $l_{OGM}$ through the optical gain material;
wherein the effective refractive index of silicon is $n_{Si}$, the effective refractive index of the interface material is $n_I$, and the effective refractive index of the optical gain material is $n_{OGM}$;

wherein the effective thermal optic coefficient (TOC) of silicon is $dn_{Si}/dT$, the effective TOC of the interface material is $dn_I/dT$, and the effective TOC of the optical gain material is $dn_{OGM}/dT$; and wherein $l_I \approx l_{OGM}*(dn_{OGM}/dT-dn_{Si}/dT)/(dn_{Si}/dT-dn_I/dT)$, whereby the effective TOC of a section of the lasing cavity that passes through the optical gain material and the interface material is substantially the same as the TOC of silicon.

13. The system of claim 11, wherein the interface material comprises one of: SiON, SiN and sapphire.

14. The system of claim 11, wherein the optical gain material comprises a semiconductor.

15. The system of claim 11, further comprising a spot-size converter (SSC) integrated into the interface waveguide, which increases the mode-field size of the optical signal before the optical signal exits the semiconductor chip.

16. The system of claim 11, wherein the mirror comprises a reflectively coated etched surface of a sacrificial silicon layer, wherein the sacrificial silicon layer is disposed over the silicon layer at a same level as the interface layer.

17. The system of claim 11, further comprising an anti-reflection coating to reduce back reflection, which is applied to an output facet of the semiconductor chip.

18. A method for operating an optical interface in a semiconductor chip, comprising:
  receiving an optical signal from a silicon waveguide in a silicon layer in the semiconductor chip;
  using an optical coupler to couple the optical signal from the silicon waveguide into an interface waveguide in an interface layer of the semiconductor chip, wherein the interface layer is comprised of an interface material and is disposed over the silicon layer, and wherein the interface waveguide channels the optical signal in a direction parallel to a top surface of the semiconductor chip; and using a mirror to reflect the optical signal from the interface waveguide in a surface-normal direction so that the optical signal exits a top surface of the semiconductor chip, wherein the mirror comprises a reflectively coated etched surface of a sacrificial silicon layer, which is at a same level as the interface layer wherein the mirror comprises a reflectively coated etched surface of a sacrificial silicon layer, wherein the sacrificial silicon layer is disposed over the silicon layer at a same level as the interface layer.

19. The method of claim 18, further comprising:
receiving a surface-normal optical signal at a top surface of the semiconductor chip;
passing the received surface-normal optical signal through the interface layer to the mirror, wherein the mirror reflects the surface-normal optical signal into the interface waveguide which channels the reflected optical signal in a direction parallel to the top surface of the semiconductor chip; and
using the optical coupler to couple the reflected optical signal from the interface waveguide in the interface layer into the silicon waveguide in the silicon layer.

\* \* \* \* \*

UNITED STATES PATENT AND TRADEMARK OFFICE
CERTIFICATE OF CORRECTION

PATENT NO.       : 9,964,702 B1
APPLICATION NO.  : 15/292501
DATED            : May 8, 2018
INVENTOR(S)      : Luo et al.

Page 1 of 1

It is certified that error appears in the above-identified patent and that said Letters Patent is hereby corrected as shown below:

On the Title Page

Under Notice, Line 3, delete "days. days." and insert -- days. --, therefor.

In the Specification

In Column 1, Line 54, delete "MN" and insert -- III-V --, therefor.

In Column 7, Line 3, delete "do/dT" and insert -- dn/dT --, therefor.

In the Claims

In Column 9, Line 54, in Claim 5, after "a" insert -- III-V --.

In Column 11, Line 13, in Claim 14, after "a" insert -- III-V --.

In Column 12, Line 12, in Claim 18, delete "layer" and insert -- layer, --, therefor.

Signed and Sealed this
Sixth Day of November, 2018

Andrei Iancu
*Director of the United States Patent and Trademark Office*